United States Patent
Babcock et al.

(10) Patent No.: US 6,660,616 B2
(45) Date of Patent: Dec. 9, 2003

(54) P-I-N TRANSIT TIME SILICON-ON-INSULATOR DEVICE

(75) Inventors: Jeffrey A. Babcock, Neufahrn (DE); Gregory E. Howard, Dallas, TX (US); Angelo Pinto, Munich (DE); Phillipp Steinmann, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/055,436

(22) Filed: Jan. 23, 2002

(65) Prior Publication Data

US 2002/0100950 A1 Aug. 1, 2002

Related U.S. Application Data

(60) Provisional application No. 60/265,464, filed on Jan. 31, 2001.

(51) Int. Cl.$^7$ .................................................. H01L 21/20
(52) U.S. Cl. ...................... 438/479; 438/400; 438/405
(58) Field of Search .................................. 257/104, 105, 257/106, 551, 603, 604, 656, 347, 283, 481; 438/91, 141, 149, 237, 328, 380, 479, 517

(56) References Cited

U.S. PATENT DOCUMENTS

| | | | | |
|---|---|---|---|---|
| 5,047,829 A | * | 9/1991 | Seymour et al. ............. | 257/656 |
| 5,726,440 A | * | 3/1998 | Kalkhoran et al. .......... | 257/436 |
| 5,877,521 A | * | 3/1999 | Johnson et al. .............. | 438/404 |
| 6,008,527 A | * | 12/1999 | Kasahara ..................... | 257/656 |
| 6,049,109 A | * | 4/2000 | Omura et al. ................ | 257/656 |

OTHER PUBLICATIONS

Paul J. Stabile et al., "Lateral IMPATT Diodes," IEEE Electron Device Letters, vol. 10, No. 6, Jun. 1989, pp249–251.

* cited by examiner

Primary Examiner—Shouxiang Hu
Assistant Examiner—Quang Vu
(74) Attorney, Agent, or Firm—Jacqueline J. Garner; W. James Brady, III; Frederick J. Telecky, Jr.

(57) ABSTRACT

A transit time device (15, 15') in a silicon-on-insulator (SOI) technology is disclosed. An anode region (18) and a cathode region (20) are formed on opposing ends of an epitaxial layer (14), with an intrinsic or lightly-doped region (22) disposed therebetween. Sinker structures (30p, 30n) are formed in an overlying epitaxial layer (24) over and in contact with the anode and cathode regions (18, 20). A charge injection terminal may be formed in a sinker structure (32n) in the overlying epitaxial layer (24), if the transit time device (15') is of the three-terminal type. The device (15, 15') has extremely low parasitic capacitance to substrate, because of the buried oxide layer (12) underlying the intrinsic region (22).

6 Claims, 3 Drawing Sheets

P-I-N TRANSIT TIME SILICON-ON-INSULATOR DEVICE

CROSS-REFERENCE TO RELATED APPLICATIONS

This application claims priority under 35 USC §119(e)(1) of provisional application No. 60/265,464 filed Jan. 31, 2001.

STATEMENT REGARDING FEDERALLY SPONSORED RESEARCH OR DEVELOPMENT

Not applicable.

BACKGROUND OF THE INVENTION

This invention is in the field of integrated circuits, and is more specifically directed to silicon-on-insulator integrated circuits.

In the field of high frequency electronics, for example in radio frequency and microwave applications, transit time devices are well known design elements for switching and attenuating signals.

One class of transit time device are p-i-n diodes, constructed as a p-n diode with a lightly doped or intrinsic (corresponding to the "i") semiconductor region disposed between the p-type and n-type regions. In a forward biased state, a large number of holes and electrons are created in the intrinsic region enabling current to be conducted from the p-type region to the n-type region. Upon removal of the bias, the charge carriers remain in the intrinsic region for some time prior to recombination, due to the absence of recombination sites in this region. In contrast, conventional p-n diodes rapidly cease conduction in response to the removal of bias, due to the relatively high dopant concentration of the anode and cathode regions.

This behavior of the p-i-n diode is used to advantage in high frequency applications, because the residual charge carriers also remain in the intrinsic region when a high frequency signal is superimposed on a forward bias current. This behavior is reflected in apparent negative resistance for small signal variations, providing a variable resistor having decreasing resistance with increasing bias current.

As evident from the foregoing, and as known in the art, the characteristics of the p-i-n diode depend upon the carrier transit time in the intrinsic region. The term "transit time device" is of course due to this relationship. As known in the art, transit time devices are also quite compatible with conventional manufacturing, at least in the respect that the saturation velocity, upon which transit time depends, is insensitive to doping levels and conductivity type. However, in conventional silicon integrated circuit manufacturing technologies, the performance of transit time devices is limited by the parasitic capacitance of the intrinsic region to substrate. Because these parasitics are nonlinearly dependent on operating frequency and also on device bias, silicon p-i-n diodes in bulk are not particularly useful for high frequency operation.

FIG. 1 illustrates, in cross-section, an example of a conventional p-i-n diode constructed in bulk silicon. In this example, n-type well 4 is formed into substrate 2. At the surface of n-well 4, the p-i-n diode is formed by p+ region 6 that is implanted or otherwise diffused into well 4; p+ contact region 8 (and overlying silicide, if desired) is formed at the surface of p+ region 6. The cathode of the diode has n+ contact region 9, which is also silicide-clad if desired. Silicon dioxide isolation structures 7 isolate contact regions 8, 9 from one another at the surface of the device.

In operation, a forward bias voltage is applied to contact region 8 relative to contact region 9, anode-to-cathode. Because of the large discrepancy in doping concentration between p+ region 6 and n-well 4, a significant space-charge region 4' is produced in a significant portion of well 4, adjacent to p+ region 6, even in the presence of this forward bias. The size of this region 4' is effective defined by the width of isolation structure 7 between p+ region 8 and n+ region 9. The depletion of carriers in space-charge region 4' effectively places this region in a state similar to intrinsic silicon; as such, the device operates as a p-i-n diode. As noted above, p-i-n diodes are useful in high frequency applications, given their negative resistance characteristics.

However, significant parasitic capacitance $C_p$ is present between space-charge region 4' and substrate 2, as suggested in FIG. 1. In high frequency applications, substantial parasitic capacitance $C_p$ causes signal cross-talk among nearby devices in common substrate 2, as well as energy loss in the signal at high frequencies resulting from the charging and discharging of this capacitance $C_p$.

Various known approaches to the fabrication of high performance transit time devices have encountered significant limitations. In bulk silicon, a triple-well process may be used to isolate the space-charge region from the substrate, but at significant manufacturing cost. Gallium arsenide p-i-n diodes have excellent performance, but are quite costly to manufacture not only because of material cost, but also because of the limited integration density available in GaAs technology. The p-i-n devices on semi-insulating GaAs substrates are particularly expensive, in no small part due to the necessity of mesa isolation. Silicon-on-sapphire lateral p-i-n diodes are also known in the art, as described in Stabile et al., "Lateral IMPATT diodes", *Elec. Dev. Letters*, Vol. 10, No. 6 (IEEE, 1989); this technology is not only costly from a material standpoint, but also involves significantly higher defect densities than bulk silicon. Lateral isolation is also lacking in conventional silicon-on-sapphire technology.

BRIEF SUMMARY OF THE INVENTION

It is therefore an object of the present invention to provide a p-i-n diode transit time device in which parasitic capacitance to substrate is substantially limited.

It is a further object of the present invention to provide such a device in which the transit time may be determined by a non-critical photolithography operation.

It is a further object of the present invention to provide such a device in which a center transit time charge injection terminal may be readily provided.

It is a further object of the present invention to provide such a device that may be fabricated according to conventional silicon manufacturing technology.

Other objects and advantages of the present invention will be apparent to those of ordinary skill in the art having reference to the following specification together with its drawings.

The present invention may be implemented into an integrated circuit fabricated using silicon-on-insulator (SOI) technology. In an epitaxial single-crystal layer overlying a buried oxide layer, p-type and n-type buried layer regions are formed by masked ion implantation on opposite ends of a contiguous portion of the layer. The region of the epitaxial layer disposed between the buried layer regions is at most lightly doped, if not intrinsic silicon. Contacts are made to the buried layer regions, and optionally to a location within the intermediate intrinsic region to provide charge injection. The resulting device, which may be connected to an adjacent active device such as a transistor, provides a p-i-n diode, having minimal parasitic capacitance to substrate.

DETAILED DESCRIPTION OF THE INVENTION

The present invention will now be described relative to its preferred embodiments. It is contemplated that those skilled in the art having reference to this specification will be readily able to implement the present invention not only in the manner described in this specification by way of example, but also according to various alternative realizations that also benefit from the present invention. It is therefore to be understood that these and other alternative implementations of the present invention are within the scope of the present invention as claimed.

Figure 1:
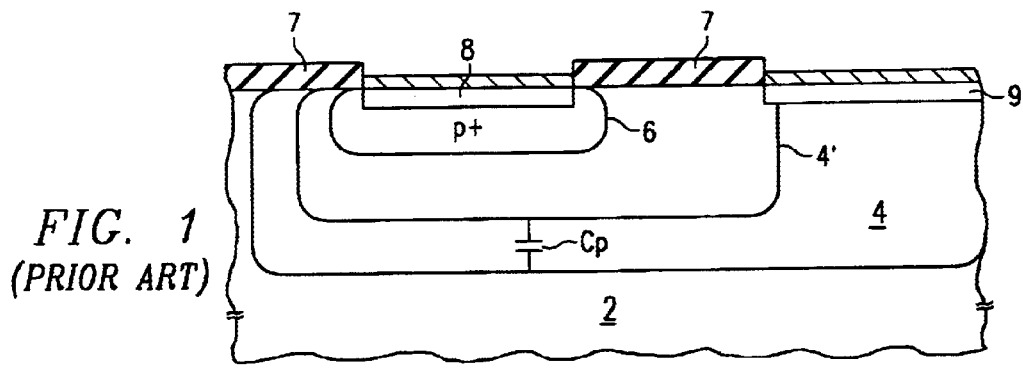
FIG. 1 is a cross-sectional illustration of a conventional p-i-n diode formed in bulk silicon.
Figure 2A:
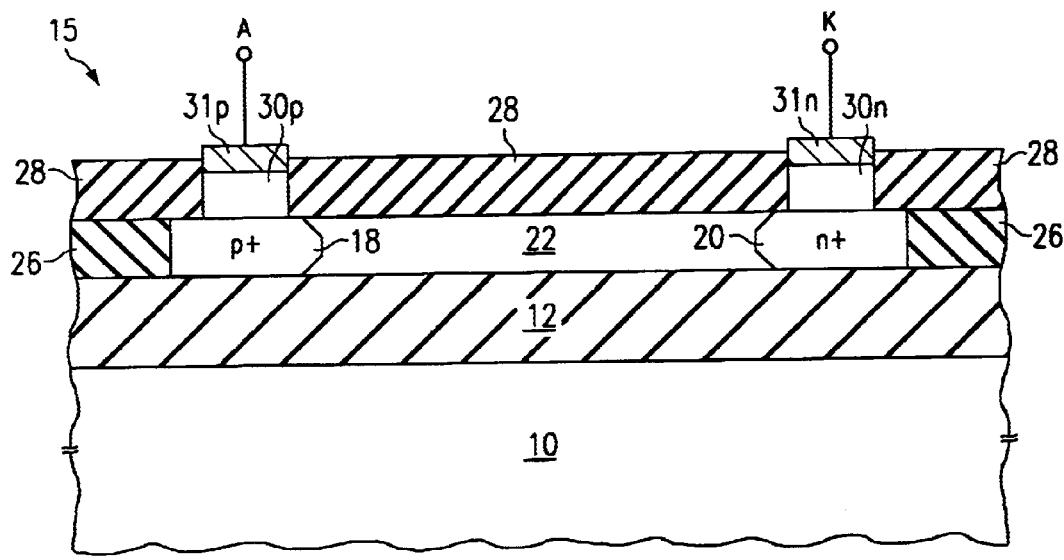
FIGS. 2a and 2b are cross-sectional and plan views of a two-terminal p-i-n diode according to the preferred embodiment of the invention.
Figure 2B:
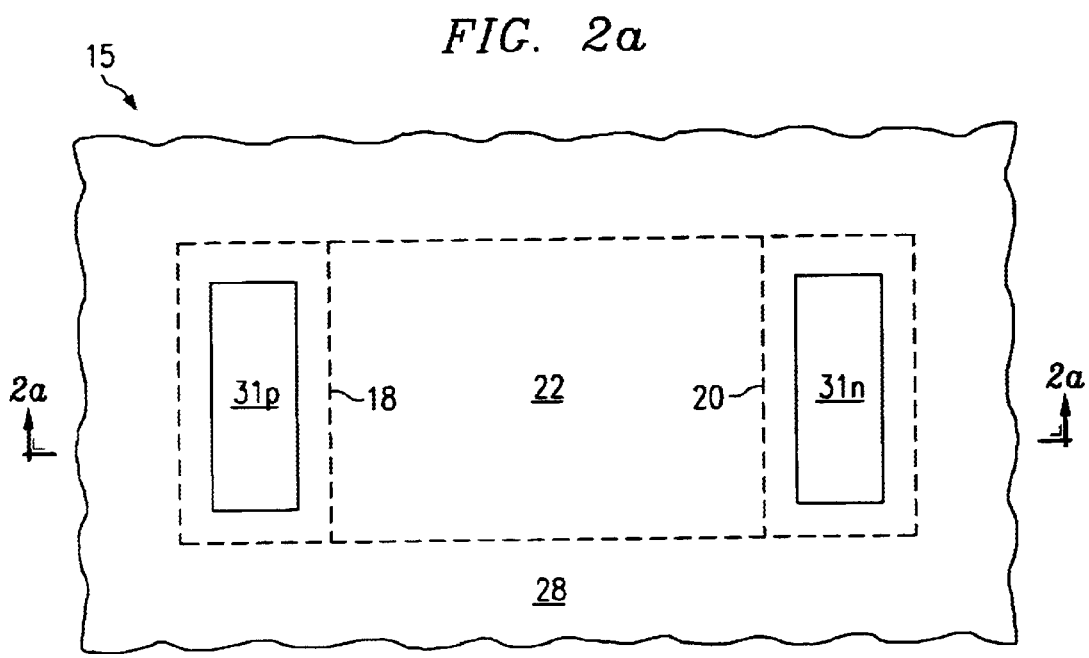

Referring now to FIGS. 2a and 2b, p-i-n diode 15 according to a first preferred embodiment of the invention will now be described. Diode 15 is formed in a single-crystal silicon layer that is isolated from substrate, or handle wafer, 10, by buried oxide layer 12. For improved device performance, handle wafer 10 is preferably a high resistance semiconductor substrate. In this example, buried oxide layer 12 is contemplated to be on the order of $1.0\mu$ in thickness. It is of course contemplated that the present invention may alternatively be implemented in connection with thinner buried oxide layers, and also in connection with other types of buried insulator technologies, such as silicon-on-glass (SOG), silicon-on-sapphire (SOS), and silicon over other insulating materials. The active elements of diode 15 in this layer include p+ region 18, n+ region 20, and lightly-doped or intrinsic region 22 disposed between regions 18, 22. Deep isolation oxide 26 surrounds p+ region 18, n+ region 22, and intrinsic region 22, as shown both in FIGS. 2a and 2b.

Electrical contact is made to p+ region 18 and n+ region 20 at the surface of the device, through structures that extend to the surface through shallow isolation oxide 28. P+ sinker structure 30p overlies p+ region 20, and is typically formed of implanted epitaxial silicon; an additional more heavily doped region (not shown) may be formed at the surface of sinker structure 30p. Similarly, n+ sinker structure 30n of implanted epitaxial silicon similarly overlies n+ region 18, and may also include a more heavily-doped region (not shown) at its surface if desired. In this exemplary embodiment, ohmic contact to sinker structures 30p, 30n is further improved by refractory metal silicide cladding 31p, 31n, respectively. In this manner, anode connection A is made to p+ region 18 via silicide-clad sinker structure 30p, and cathode connection K is made to n+ region 20 via silicide-clad sinker structure 30n.

Intrinsic region 22 disposed between p+ region 18 and n+ region 20 provides the appropriate structure for the well-known negative resistance behavior of p-i-n diode 15. In this example, the distance between p+ region 18 and n+ region 20 through intrinsic region 22 defines the transit time of carriers between the anode and cathode of diode 15, and thus defines the electrical behavior of diode 15. Once diode 15 is forward biased so that anode-cathode current is conducted through intrinsic region 22, small signal variations on this bias current will have the desired negative resistance behavior.

According to the preferred embodiments of the invention, however, as exemplified by diode 15 of FIGS. 2a and 2b, the parasitic capacitance between intrinsic region 22 and substrate 10 is effectively zero. This low capacitance is due to the thick buried oxide 12 disposed between these elements. Given the small feature sizes contemplated for diode 15, it is contemplated that the cross-sectional area of intrinsic region 22 overlying substrate 10 is sufficiently small, relative to the thickness of buried oxide 12, that the parasitic capacitance is effectively insignificant. Accordingly, it is contemplated that diode 15 will be particularly beneficial in high frequency applications, such as microwave and RF circuits, without vulnerability to cross-talk and other noise issues, and without consuming significant energy by charging and discharging the parasitic capacitances. Further performance improvements may be attained by using high resistance material as substrate 10.

According to the preferred embodiments of the invention, and as will now be described relative to FIGS. 3a through 3c and FIG. 2a, diode 15 may be easily fabricated according to a robust manufacturing process. Indeed, it will become apparent from the following description that the carrier transit time of diode 15, determined primarily by the distance of intrinsic region between the anode and cathode elements, may be defined using a relatively non-critical photolithographic operation. It is further contemplated that many of the process steps involved in constructing diode 15 may be common with those used to form other devices, such as bipolar and metal-oxide-semiconductor (MOS) transistors, on the same integrated circuit. As such, the present invention provides a p-i-n diode with excellent electrical characteristics that may be fabricated with little if any additional manufacturing cost relative to the other devices in the circuit.

Figure 3A:
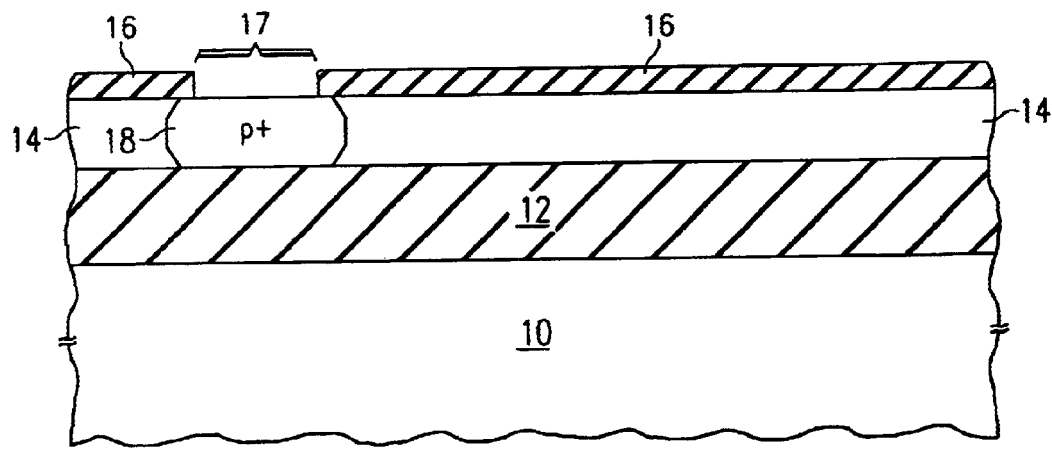
FIGS. 3a through 3c are cross-sectional views illustrating various stages in the manufacture of the p-i-n diode of FIGS. 2a and 2b according to the preferred embodiment of the invention.

FIG. 3a illustrates p-i-n diode 15 in an early stage of manufacture. Prior to this point in the process, the silicon-on-insulator (SOI) starting material is fabricated in the conventional manner. In this example, high resistivity substrate 10, serving as a handle wafer, has a relatively thick (e.g., on the order of $1\mu$) buried silicon dioxide layer 12 disposed thereupon. Layer 14 of epitaxial, single-crystal, silicon is then formed over buried oxide 12 in the conventional manner. In this embodiment of the invention, epitaxial layer 14 is a very lightly doped layer, for example having a doping concentration that is not significantly greater than $1.0 \times 10^{15}$ cm$^{-3}$, as a portion of layer 14 will be used as intrinsic region 22 of the eventual p-i-n diode 15. Typically, SOI wafers with epitaxial layer 14 disposed over buried oxide 12 on substrate 10 are manufactured as so-called "starting material", according to the specifications, including epitaxial layer doping concentration, provided by the purchasing eventual wafer fabrication facility. The initial thickness of epitaxial layer 14 according to this preferred embodiment of the invention is on the order of $1.25\mu$.

Thermal masking oxide 16 is then formed over the surface of the wafer, consuming a portion of epitaxial silicon layer 14, as shown in FIG. 3a. For example, it is contemplated that masking oxide 16 will reduce the thickness of epitaxial layer 14 to on the order of 0.8µ. By way of photolithographic patterning, opening 17 is formed to expose a selected portion of epitaxial layer 14. Ion implantation of p-type dopant, typically boron, is then performed over the structure; masking oxide 16 of course blocks the implant, and permits the implant to reach epitaxial layer 14 through opening 17. Following an anneal (either performed at this point, or after other implants to be described below), p+ region 18 is formed in epitaxial layer 14 at location 17, and preferably extends through epitaxial layer 14 to buried oxide 12.

Figure 3B:
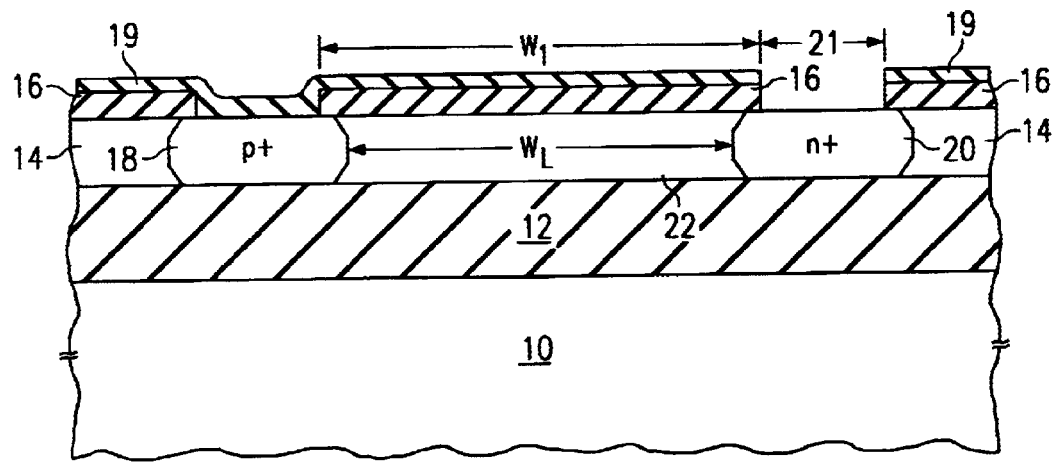
Figure 3C:
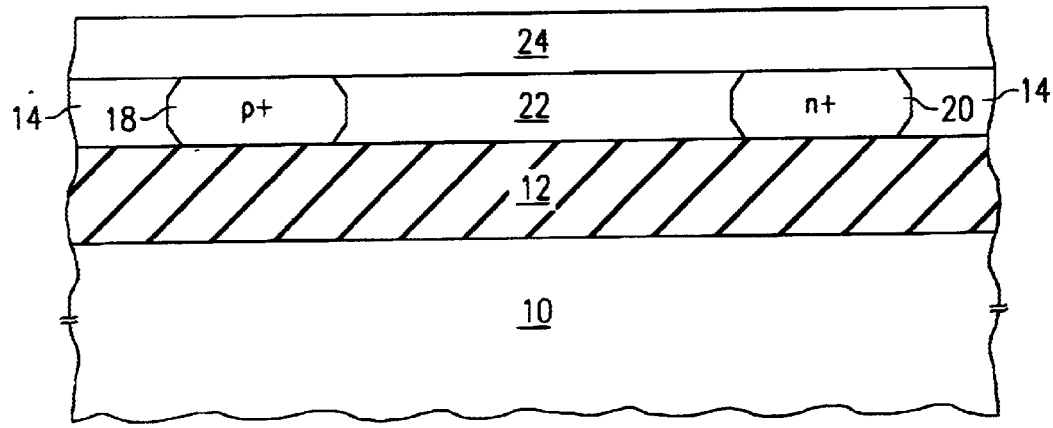

According to the preferred embodiment of the invention, second masking layer 19 is then disposed over the surface, for example by way of chemical vapor deposition. This masking layer 19 is then photolithographically patterned, and etched to form opening 21 through both layers 16, 19, exposing another location of epitaxial layer 14 as shown in FIG. 3b. According to this preferred embodiment of the invention, the distance $W_1$ between the edges of openings 17, 21 is a photolithographic dimension upon which the eventual corresponding length of intrinsic region 22 will depend. This distance $W_1$ is much larger than the minimum patterned feature size in the device (as indicated by its relative size to that of openings 17, 21).

Ion implantation of n-type dopant, such as phosphorous or arsenic, is then performed. Masking layers 16, 19 prevent this dopant from reaching epitaxial silicon 14 except at the location of opening 21. An anneal is then performed, either separately from or together with the anneal of boron dopant to form p+ region 18. Following the anneal, n+ region 20 is formed in epitaxial layer 14 at the location of opening 21, extending through epitaxial layer 14 to buried oxide 12, as shown in FIG. 3b.

Intrinsic region 22 is defined as the portion of epitaxial layer 14 between p+ region 18 and n+ region 20. In this embodiment of the invention, the doping concentration and distribution in intrinsic region 22 simply corresponds to those parameters of epitaxial layer 14 as it was formed. Alternatively, an additional doping step (which may or may not be masked) may be applied to the structure to set or compensate this doping concentration and distribution. In either case, intrinsic region 22 is quite lightly-doped, at most, relative to p+ region 18 and n+ region 20.

The length of the path through intrinsic region 22 from anode (p+ region 18) to cathode (n+ region 20) in p-i-n diode 15 has a length $W_L$ as shown in FIG. 3b. This length $W_L$ is defined by the photolithographic length $W_1$ between windows 17, 21, less the extent of lateral diffusion of p+ region 18 and n+ region 20 into intrinsic region 22. This path length is therefore substantially defined by photolithography of these openings 17, 21. However, the distance $W_1$ need not be set with a high degree of precision, and is therefore robust from a process control standpoint.

Following the formation of p+ region 18, n+ region 20, and the intervening intrinsic region 22 (separately doped, if desired), masking oxide layers 16, 19 are removed from the surface of epitaxial layer 14. A pre-epitaxial cleanup is then applied to the surface of epitaxial layer 14, followed by the epitaxial growth of single-crystal silicon layer 24 from layer 14, resulting in the structure shown in FIG. 3c. Epitaxial layer 24 in diode 15 is preferably the same layer as a collector layer in bipolar or heterojunction bipolar transistors elsewhere in the integrated circuit, for manufacturing efficiency. Preferably, epitaxial layer 24 is not doped in situ during its formation, to avoid subsequent counterdoping.

Epitaxial layer 24 is used to form surface anode A and cathode K contacts of p-i-n diode 15, according to this embodiment of the invention. Specifically, referring back to FIG. 2a, anode sinker structure 30p and cathode sinker structure 30n are formed from epitaxial layer 24. In this embodiment of the invention, photolithographic patterning exposes those portions of epitaxial layer 24 to be removed by a wet or plasma silicon etch. These removed locations define the locations of shallow trench isolation structures 28. A second patterning and etch step through epitaxial layer 14 is then performed at this time to form the locations of deep trench isolation structures 26, as shown in FIG. 2a. Both the deep and shallow isolation structures are preferably formed by depositing silicon oxide into the openings, and then planarizing the structure, producing shallow trench isolation structures 26, 28.

The remaining portions of epitaxial layer 24 are then doped by way of masked ion implantation, to increase the conductivity of these sinker structures. Such masked ion implantation exposes sinker structure 30p to p-type (e.g., boron) dopant, and sinker structure 30n to n-type (e.g., phosphorous or arsenic) dopant, with each structure 30 being masked from the opposite implant. Following the sinker implant, additional masked implants of n-type and p-type dopant may be applied to the surface of sinker structures 30n, 30p, respectively, to more heavily dope the surface of these structures and further reduce the resistivity of the anode and cathode contacts. This additional implant may correspond to the source/drain implants for MOS transistors formed elsewhere in the integrated circuit. Silicide cladding 31p, 31n, may then be formed at the surface of sinker structures 30p, 30n, for example by the well-known process self-aligned direct reaction of the silicon of sinker structures 30 with a refractory metal. Shallow trench isolation structures 28 may be formed either prior to or after the doping of sinker structures 30, as desired. The resulting structure is illustrated in FIG. 2a, described above.

Alternatively, contacts may be made to p+ region 18 and n+ region 20 by way of a silicon etch of sinker structures 30p, 30n. This etch may partially extend into sinker structures 30p, 30n, or alternatively may completely etch through sinker structures 30p, 30n to provide a direct contact to p+ region 18 and n+ region 20. Metal, silicide, or other conductive material may then be formed into this etched contact, to make electrical contact to p+ region 18 and n+ region 20.

In the two-terminal device of p-i-n diode 15, the electrical characteristics are determined by the doping concentration of intrinsic region 22, as well as the path length $W_L$ between p+ region 18 and n+ region 20. The conduction mechanism of p-i-n diode 15 is initiated by avalanche breakdown from p+ region 18 and n+ region 20. Once conduction is initiated, the small-signal behavior of p-i-n diode 15, including its negative resistance behavior, is determined by the path length $W_L$, and also by the doping concentration of intrinsic region 22, which defines the voltage-dependent size of the space-charge region in diode 15. These parameters of length $W_L$ and doping concentration may, of course, be adjusted during the manufacture of diode 15 as desired. This two-terminal p-i-n diode 15 is contemplated to be particularly useful in microwave circuits.

Figure 4:
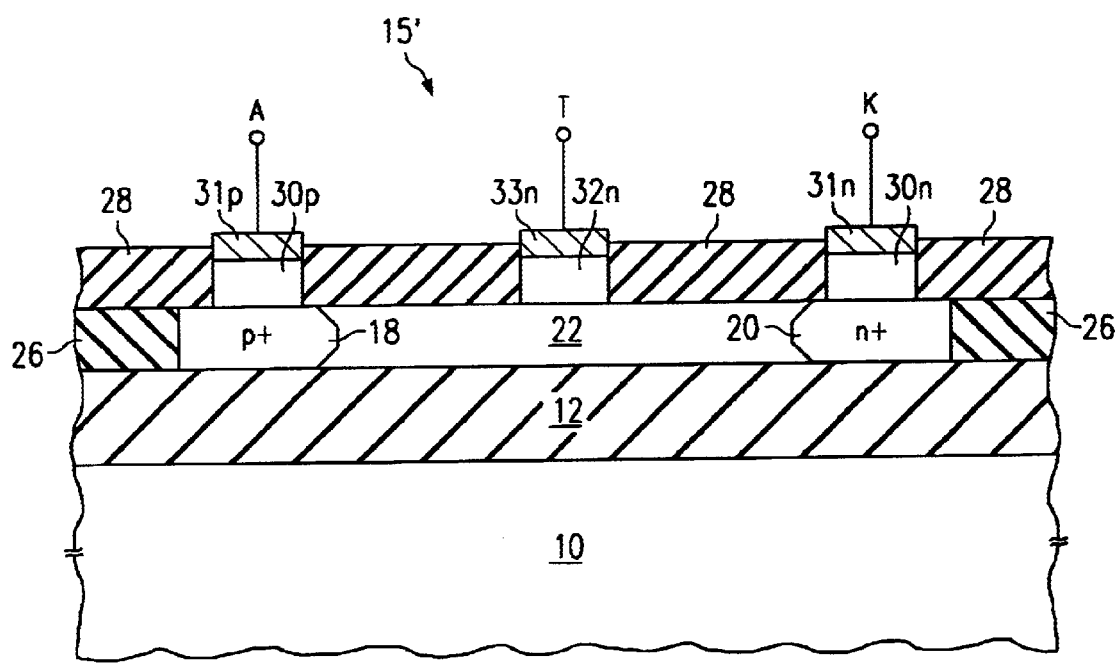
FIG. 4 is a cross-sectional view of a three-terminal transit time device according to a second preferred embodiment of the invention.

According to a second preferred embodiment of the invention, a three-terminal transit time device 15' may readily be constructed, with minor modifications to the process described above relative to diode 15. FIG. 4 illustrates transit time device 15' in cross-section, with corresponding elements of transit time device 15' referred to with the same reference numerals as those of p-i-n diode 15. As shown in FIG. 4, transit time device 15' also includes charge injection terminal T, which makes contact to a selected location of intrinsic region 22. In this example, n-doped sinker structure 32n is formed in similar manner as n-doped sinker structure 30n, in the photolithographic patterning and etching of epitaxial layer 24, described above. This patterning and etching forms sinker structure 32n by leaving a corresponding pillar remaining in layer 24; structure 32n is then implanted with n-type dopant by the same masked implant as used to dope sinker structure 30n. Source/drain n+ doping may be applied to the surface of structure 32n, if so performed for sinker structure 30n. In this embodiment of the invention, silicide cladding 33n is formed at the surface of sinker structure 32n, preferably in the same direct react silicidation process as used to form cladding 31p, 31n. Silicide 33n provides a high conductivity contact for charge injection terminal T.

In operation, three-terminal transit time device 15' has its conduction initiated by the applying of a bias voltage and current to charge injection terminal T. This current forces carriers into intrinsic region 22 (at a location selected according to the desired turn-on characteristic), initiating conduction of the device. Once conduction has been initiated from anode A to cathode K through intrinsic region 22, the amount of charge injected at terminal T may be reduced (to a holding level) or eliminated, as appropriate for the particular device. Three-terminal transit time device 15' then operates in the conventional manner for these devices.

In each of the preferred embodiments of the invention, a transit time device is constructed using compatible processes with other devices, such as bipolar transistors, heterojunction bipolar transistors, MOS transistors, and the like. The transit time device, either of the two-terminal or the three-terminal type, exhibits very little parasitic capacitance, considering that intrinsic region 22 is deployed in epitaxial silicon 14 over thick buried oxide layer 12. Additionally, the important performance characteristics of the device may be established and adjusted by way of a substantially non-critical masking distance $W_1$ that defines the separation of the anode and cathode regions 18, 20, respectively, in the same epitaxial layer 14 as intrinsic region 22. It is therefore contemplated that important performance benefits are made readily available by the present invention, at minimal added manufacturing cost.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A method of forming a transit time device in a semiconductor layer overlying an insulator layer, comprising the steps of:

masking the semiconductor layer to expose a first selected location of the semiconductor layer;

doping the exposed first selected location to a first conductivity type;

masking the semiconductor layer to expose a second selected location of the semiconductor layer, the first and second selected locations separated from one another by a distance;

doping the exposed second selected location to a second conductivity type, so that a portion of the semiconductor layer remaining between the first and second doped selected locations corresponds to an intrinsic region;

forming an isolation structure to surround the first and second doped selected locations and the intrinsic region;

doping the intrinsic region to a lightly-doped doping concentration relative to the first and second doped selected locations;

after the doping steps, forming an epitaxial layer over the semiconductor layer;

removing selected portions of the epitaxial layer, leaving first and second sinker structures overlying and in contact with the first and second doped selected locations of the semiconductor layer; and doping the first and second sinker structures to the first and respectively, so that said first and second sinker structures become the first and second conductivity types, respectively, wherein said first conductivity types is opposite to said second conductivity type.

2. The method of claim 1, wherein the step of forming an isolation structure comprises:

after the removing step, removing portions of the semiconductor layer surrounding the first and second doped selected locations and the intrinsic region;

then depositing an insulator at the locations of the removed portions of the semiconductor layer, and also the at the locations of the removed portions of the epitaxial layer.

3. The method of claim 1, wherein the removing step also leaves a charge injection sinker structure overlying and in contact with the intrinsic region;

and wherein the step of doping the first and second sinker structures also dopes the charge injection sinker structure to one of the first and second conductivity types.

4. The method of claim 3, wherein the step of forming an isolation structure comprises:

after the removing step, removing portions of the semiconductor layer surrounding the first and second doped selected locations and the intrinsic region;

then depositing an insulator at the locations of the removed portions of the semiconductor layer, and also at the locations of the removed portions of the epitaxial layer.

5. The method of claim 3, further comprising:

cladding a surface of each of the sinker structures and charge injection sinker structure with a refractory metal silicide.

6. The method of claim 5, further comprising:

cladding a surface of each of the sinker structures and charge injection sinker structure with a refractory metal silicide.

* * * * *